(12) United States Patent
Wood, III et al.

(10) Patent No.: US 11,979,978 B2
(45) Date of Patent: May 7, 2024

(54) MONOLITHIC PSTAGES AND METHODS FOR VOLTAGE REGULATORS

(71) Applicant: DELL PRODUCTS L.P., Round Rock, TX (US)

(72) Inventors: Merle Wood, III, Round Rock, TX (US); Chin-Jui Liu, Taoyuan (TW); Shiguo Luo, Austin, TX (US); Feng-Yu Wu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 606 days.

(21) Appl. No.: 17/211,430

(22) Filed: Mar. 24, 2021

(65) Prior Publication Data
US 2022/0308607 A1  Sep. 29, 2022

(51) Int. Cl.
*H05K 1/02* (2006.01)

(52) U.S. Cl.
CPC ......... *H05K 1/0209* (2013.01); *H05K 1/0207* (2013.01); *H05K 1/0215* (2013.01); *H05K 2201/10166* (2013.01); *H05K 2201/10212* (2013.01)

(58) Field of Classification Search
CPC .. H05K 1/0209; H05K 1/0207; H05K 1/0215; H05K 2201/10166; H05K 2201/10212
See application file for complete search history.

(56) References Cited

U.S. PATENT DOCUMENTS

| | | | |
|---|---|---|---|
| 7,999,520 B2 | 8/2011 | Luo et al. |
| 9,240,722 B2 | 1/2016 | Luo et al. |
| 9,647,543 B2 | 5/2017 | Luo et al. |
| 9,678,555 B2 | 6/2017 | Luo et al. |

(Continued)

OTHER PUBLICATIONS

Monolithic Power, "Intelli Phase Solution With Integrated High Side and Low Side FETs and Driver", MP86945A, Printed from Internet Mar. 6, 2021, 5 pgs.

(Continued)

*Primary Examiner* — Thanh Y. Tran
(74) *Attorney, Agent, or Firm* — Egan, Enders & Huston LLP.

(57) ABSTRACT

Monolithic power stage (Pstage) packages and methods for using same are provided that may be implemented to provide lower thermal resistance/enhanced thermal performance, reduced noise, and/or smaller package footprint than conventional monolithic Pstage packages. The conductive pads of the disclosed Pstage packages may be provided with a larger surface area for contacting respective conductive layers of a mated PCB to provide a more effective and increased heat transfer away from a monolithic Pstage package. In one example, the increased heat transfer away from the monolithic Pstage package results in lower monolithic Pstage package operating temperature and increased power output. In another example, a monolithic Pstage package may be provided with an adaptive application-oriented interface and a multi-function pin that allows the same monolithic Pstage package to automatically detect and select between a relatively higher power information handling system application, and a relatively lower power information handling system VR application.

20 Claims, 9 Drawing Sheets

(56) References Cited

U.S. PATENT DOCUMENTS

| | | |
|---|---|---|
| 9,787,172 B2 | 10/2017 | Luo et al. |
| 10,354,356 B2 | 7/2019 | Hu et al. |
| 10,372,575 B1 | 8/2019 | North et al. |
| 10,432,007 B2 | 10/2019 | Chang et al. |
| 2021/0242863 A1* | 8/2021 | Clavette .............. H02M 3/1588 |

OTHER PUBLICATIONS

MPS, "Intelli Phase Solution With Integrated High Side and Low Side FETs and Driver", MP86945A, Aug. 31, 2020, 15 pgs.

Eiland et al., "Systems and Methods to Determine System Airflow Using Fan Characteristic Curves", U.S. Appl. No. 17/146,428, filed Jan. 11, 2021, 47 pgs.

* cited by examiner

MONOLITHIC PSTAGES AND METHODS FOR VOLTAGE REGULATORS

FIELD

This application relates to power stages for information handling systems, and more particularly to power stages for voltage regulator (VR) circuitry.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

High current information handling system loads, such as for CPU's and memory, typically require multi-phase voltage regulators (VR's). As the system processor and memory power demand increases, higher power and more VR phases are required for a given system. In order to pursue a high density power solution, individual VR phases have each been implemented in a monolithic integrated silicon die. Such a monolithic VR stage contains metal oxide semiconductor field effect transistors (MOSFETs) and drivers in a single die, and is referred to as a monolithic Pstage. Thus, a monolithic Pstage of each VR phase is an integrated circuit that is usually composed of a MOSFET driver, a high-side MOSFET, and a low-side MOSFET.

For a multi-phase VR, the thermal performance of each individual monolithic Pstage is an important factor in determining the number of required VR phases, which in turn impacts overall VR density and cost. In a computer server application, system thermal resistance is less than that of a notebook application due to greater system cooling fan speed and the larger printed circuit board (PCB) to which the monolithic VR is mounted within the server. Due to the lower thermal resistance, the sever Pstage current/power capability is typically increased by about 50% as compared to notebook Pstage applications. To improve the monolithic Pstage thermal capability, one approach is to add more MOSFET cells onto the monolithic Pstage silicon to lower MOSFET turn-on resistance and thus reduce $I^2R$ loss. However increasing the number of MOSFET cells requires more silicon die space or increased die area, and the downside of this increased die area is an increased monolithic Pstage cost that notebook applications cannot accept. Consequently, it is not feasible for computer servers and notebook computers to utilize the same type of conventional monolithic Pstage device.

FIG. 1 illustrates an overhead view of the top side of a conventional power stage (Pstage) package 100 that includes a conventional monolithic Pstage die. The conventional Pstage package 100 of FIG. 1 has a bottom side that is configured to be mated to a top side of a PCB 250 (shown in FIG. 2) that includes VR circuitry, which includes VR output power bus/es and in computer server applications may include a VR pulse width modulation (PWM) microcontroller. The Pstage package 100 has multiple relatively thin and discrete electrically and thermally conductive metal strips 110, 112 and 114 (shown in dashed hidden lines) disposed on the bottom side of the Pstage package 100 that are each configured to electrically and thermally connect to a corresponding respective electrically conductive metal plane 202, 204 or 206 on the top side of the underlying PCB 250 as shown in FIG. 2. These discrete conductive strips provide multiple respective electrical paths that conduct input DC voltage (VIN) and system ground (PGND) to the monolithic Pstage die from respective input power plane 202 and ground plane 204 of the PCB 250, and that conduct a switched DC output power (SW) from the monolithic Pstage die to a switching node (output power) plane 206 of the PCB 250 in response to control signals received at input pins of package 100 that include a PWM pin, together with either a SYNC pin (which is only present in the case of a notebook computer application) or an EN pin (which is only present in the case of a computer server application) as described further below.

The total thermally conductive surface area of relatively thin and separate discrete conductive strips 110, 112 and 114 represent less than 50% of the total bottom side surface area of the conventional Pstage package 100, and provide limited thermal contact area between circuitry of the monolithic Pstage die and circuitry of the Pstage package 100. As such, conductive strips 110, 112 and 114 present a relatively high thermal resistance to heat flow from the monolithic Pstage die and package 100 to the underlying PCB 250. This relatively high thermal resistance results in higher Pstage die MOSFET operating temperature and therefore limits the available Pstage die operating capacity and the amount of its available power output to switching node (output power) plane 206. Due to insufficient heat transfer via strips 110, 112 and 114 from Pstage package 100 to PCB 250, the maximum available output power from Pstage package 100 that may be provided to the PCB across the output power (SW) conductive strips is less than the maximum output power capacity of the monolithic Pstage die of the Pstage package 100.

FIG. 2 illustrates an overhead view of a top side of two conventional Pstage packages 100A and 100B mounted on an upper surface of a conventional PCB 250 to provide a conventional two-phase VR configuration such as used to power a system load of a conventional computer server in which the PCB 250 is installed. FIG. 2 also illustrates the conventional Pstage PCB routing provided for the conventional two-phase VR configuration of FIG. 2. Due to the geometry of the input power strips 100 of each Pstage package 100, a separate input power plane 202A is required to mate with input power strips 110 of Pstage package 100A, and a separate input power plane 202B is required to mate with input power strips of Pstage package 100B. In turn, separate groups of multiple input decoupling capacitors 270 and 272 are required on PCB 250 for respective separate input power planes 202A and 202B.

Specifically, in the conventional configuration of FIG. 2, input power planes 202A and 202B are separated from each other and partially "islanded" immediately adjacent and alongside a respective noisy switching node 206A or 206B, which causes increased PCB inductance, leading to higher switching/circuit noise and the need for a relatively large number of input decoupling capacitors 270 on a first terminal of each of input power planes 202A and 202B. To attempt to compensate for noise from respective adjacent switching nodes 206A and 206B, additional input decoupling capacitors 272 are also required on an opposite side second terminal of each of input power planes 202A and 202B. Further, the conventional PCB layout also impacts the thermal performance of each Pstage 100A and 100B since the separate smaller input power planes 202A and 202B (coupled to Pstage high side MOSFETs) are blocked in each phase, and the separate larger ground planes 204A and 204B (coupled to Pstage low side MOSFETs) are blocked in each phase. This results in a input power plane thermal path that provides less thermal relief for the high side MOSFETs than is provided to the low side MOSFETs by the thermal path of the ground plane.

Still referring to the conventional configurations of FIGS. 1 and 2, the control interface for each Pstage 100A and 100B is different for notebook computer applications than computer server applications. In a relatively lower power notebook computer Pstage application, a Pstage SYNC pin (shown in FIG. 1) is provided that supports Intel PS4 processor commands for lower quiescent power. However, in a relatively higher power computer server Pstage application, a Pstage EN pin is provided that supports signals from a PWM microcontroller signals, e.g., to turn off all MOSFETs immediately once a catastrophic failure happens. Thus, the conventional monolithic Pstage package that is provided for notebook computer applications is a differently configured and manufactured product than the conventional monolithic Pstage package that is provided for computer server applications.

SUMMARY

Disclosed herein are monolithic power stage (Pstage) packages that may be implemented with electrically and thermally conductive pads that provide lower thermal resistance/enhanced thermal performance, reduced noise, and/or smaller package footprint than conductive contact strips of conventional monolithic Pstage packages. In one embodiment, the conductive pads of the disclosed Pstage packages may be provided with a larger surface area for contacting respective conductive (e.g., metal) planar layers of a mated PCB than the conductive contact strips of conventional Pstage packages. This larger conductive pad surface area thus provides a more effective and increased heat transfer away from a monolithic Pstage package and its Pstage die to a mated PCB. In such an embodiment, the increased heat transfer from the monolithic Pstage die to a mated PCB results in lower operating temperature of Pstage metal oxide semiconductor field effect transistors (MOSFETs) as compared to MOSFET operating temperature of a conventional Pstage package configuration. Thus, in one embodiment the available Pstage die operating capacity and corresponding amount of available power output from the disclosed Pstage package to a mated PCB is greater than can be provided to a mated PCB by a conventional Pstage package with the same type of Pstage die.

In one embodiment, the geometry of thermally-conductive pads of a monolithic Pstage package may be oriented to allow a switching node (SW) of a mated PCB to be shielded on opposing sides by PCB ground planes in a manner that reduces noise and voltage spikes that are imparted from the switching node to an input power plane of the PCB. Thus, as compared to the relatively thin and discrete contact strips of conventional monolithic Pstage packages (such as the conventional monolithic Pstage package 100 shown in FIG. 1), a geometry of relatively wider electrically and thermally conductive monolithic Pstage pads may be implemented in one embodiment to require fewer input decoupling capacitors to be provided on an input power plane of a mated PCB. This is because the geometry of the various conductive pads of this embodiment allow the noisy PCB switching node (SW) to be shielded on opposite sides by ground planes to reduce noise and voltage spikes imparted from the switching node to the input power plane. In contrast, to reduce noise and voltage spikes imparted to the PCB input power plane the conventional monolithic Pstage configuration needs a larger number of input decoupling capacitors provided on a mated PCB than is required for the disclosed monolithic Pstage package configurations since the geometry and shape of the contact strips on a conventional monolithic Pstage package require that the PCB input power plane be partially islanded adjacent the PCB switching node, which results in less effective decoupling. Thus, a reduced number of PCB input decoupling capacitors, less PCB space, and less overall cost may be employed for the disclosed circuitry and methods as compared to what is required for a conventional Pstage package and PCB configuration such as illustrated in FIGS. 1 and 2.

In one embodiment, a monolithic Pstage package footprint and pin arrangement may be configured to facilitate and allow optimization of a multi-phase VR layout. For example, the disclosed monolithic Pstage packages may be used to implement a multi-phase voltage regulator (VR) configuration in which PCB vias and/or input decoupling capacitors may be shared by the input power pads of multiple different monolithic Pstage packages, e.g., so as to improve interleaving characteristics and to better utilize the same input capacitance and input power vias across multiple different monolithic Pstage packages mated to the same PCB. This capacitance-sharing capability results in less required capacitance (i.e., resulting in lower cost and reduced PCB space requirement for capacitors), as well as providing reduced switching VR noise. In one embodiment, the resulting lower cost of the disclosed monolithic Pstage package configurations allow a monolithic Pstage package that is capable of meeting the relatively higher VR power needs of a computer server application to also be employed in a cost-effective manner in a relatively lower VR power application such as notebook computer.

In one embodiment, a monolithic Pstage package may be provided with an adaptive application-oriented interface and a multi-function pin that allows the same monolithic Pstage package (and its monolithic Pstage die) to automatically detect and select between a relatively higher power information handling system VR application (e.g., such as a computer server or desktop computer application), and a relatively lower power information handling system VR application (e.g., battery-powered portable information handling system applications such as a notebook or tablet computer application). In one embodiment, the multi-function pin may be provided in the form of a combined EN/SYNCH pin that operates with circuitry within a monolithic Pstage that is programmed to implemented an adaptive EN/SYNCH function. In such embodiments, the same monolithic Pstage device design configuration may be used, for example, in both relatively lower power applications (e.g., a portable information handling system such as a notebook computer) and relatively higher power applications (e.g., a computer server) applications. In such an embodiment, it is therefore possible to drive down the cost of the disclosed monolithic Pstage package devices since they may be produced in higher volume for use in powering both relatively higher power information handling systems such as computer servers and relatively lower power information handling systems such as notebook computers. This is in contrast to existing conventional Pstage packages in which the PWM control interface for conventional Pstage packages is different for computer servers and notebook computers, which therefore requires use of a Pstage package configuration for computer servers that is different from the Pstage package configuration that is required for notebook computers.

In one respect, disclosed herein is a monolithic power stage (Pstage) package, including: a monolithic Pstage integrated circuit including a voltage input, a voltage output, a ground node, and one or more field effect transistor (FET) switching devices coupled between the voltage input, the ground node and the voltage output and providing regulated power to the voltage output; and multiple separate electrically and thermally conductive pads exposed on a bottom side surface of the monolithic Pstage package, the multiple separate electrically and thermally conductive pads including an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit. The switching node pad may be disposed on the monolithic Pstage package bottom side surface between, and in adjacent side-by-side relationship to, the first and second ground pads. The input power pad may extend between opposing sides of the monolithic Pstage package bottom side surface and may be disposed in adjacent side-by-side relationship to each of the first and second ground pads and the switching node pad.

In another respect, disclosed herein is an information handling system, including: a printed circuit board (PCB); a system load; and at least one monolithic power stage (Pstage) package mechanically mated to a top side surface of the PCB. The monolithic Pstage package may include: a monolithic Pstage integrated circuit including a voltage input, a voltage output, a ground node, and one or more field effect transistor (FET) switching devices coupled between the voltage input, the ground node and the voltage output and providing regulated power to the voltage output; and multiple separate electrically and thermally conductive pads exposed on a bottom side surface of the monolithic Pstage package, the multiple separate electrically and thermally conductive pads including an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit. The switching node pad may be disposed on the monolithic Pstage package bottom side surface between, and in adjacent side-by-side relationship to, the first and second ground pads. The input power pad may extend between opposing sides of the monolithic Pstage package bottom side surface and may be disposed in adjacent side-by-side relationship to each of the first and second ground pads and the switching node pad. The input power pad may be thermally and electrically coupled to a thermally and electrically conductive input power plane disposed on the top side surface of the PCB. The first and second ground pads may be thermally and electrically coupled to respective thermally and electrically conductive first and second ground planes disposed on the top side surface of the PCB. The switching node pad may be thermally and electrically coupled to a thermally and electrically conductive switching node plane disposed on the top side surface of the PCB. The switching node plane may be electrically coupled to the system load and may be disposed on the PCB top side surface between, and in adjacent side-by-side relationship to, the first and second first and second ground planes. The input power plane may be disposed on the PCB top side surface in adjacent side-by-side relationship to each of the first and second ground planes and the switching node plane.

In another respect, disclosed herein is a method, including: receiving an input voltage at a voltage input of at least one monolithic power stage (Pstage) integrated circuit of a monolithic Pstage package, the at least one monolithic Pstage integrated circuit further including a voltage output, a ground node, and one or more field effect transistor (FET) switching devices coupled between the voltage input, the ground node and the voltage output; and controlling the one or more field effect transistor (FET) switching devices to provide regulated power to the voltage output of the at least one monolithic Pstage integrated circuit to power a system load of an information handling system. The at least one monolithic power stage (Pstage) package may include: multiple separate electrically and thermally conductive pads exposed on a bottom side surface of the monolithic Pstage package, the multiple separate electrically and thermally conductive pads including an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit. The switching node pad may be disposed on the monolithic Pstage package bottom side surface between, and in adjacent side-by-side relationship to, the first and second ground pads. The input power pad may extend between opposing sides of the monolithic Pstage package bottom side surface and may be disposed in adjacent side-by-side relationship to each of the first and second ground pads and the switching node pad. The at least one monolithic power stage (Pstage) package may be mechanically mated to a top side surface of a printed circuit board (PCB). The input power pad may be thermally and electrically coupled to a thermally and electrically conductive input power plane disposed on the top side surface of the PCB. The first and second ground pads may be thermally and electrically coupled to respective thermally and electrically conductive first and second ground planes disposed on the top side surface of the PCB. The switching node pad may be thermally and electrically coupled to a thermally and electrically conductive switching node plane disposed on the top side surface of the PCB. The switching node plane may be electrically coupled to the system load and may be disposed on the PCB top side surface between and in adjacent side-by-side relationship to the first and second first and second ground planes. The input power plane may be disposed on the PCB top side surface in adjacent side-by-side relationship to each of the first and second ground planes and the switching node plane.

DESCRIPTION OF ILLUSTRATIVE EMBODIMENTS

Figure 3:
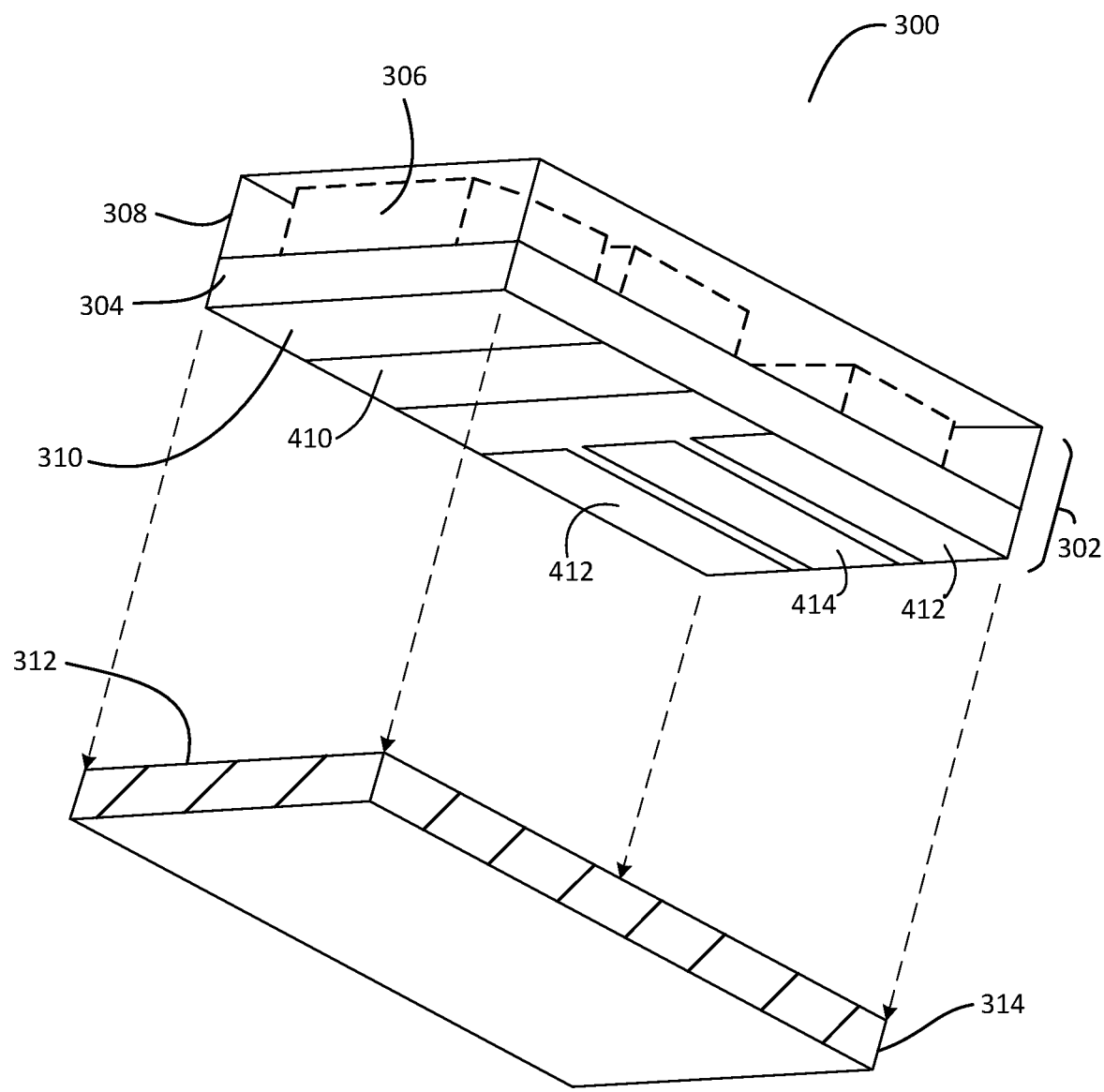
FIG. 3 illustrates an exploded under side perspective view of an assembly according to one exemplary embodiment of the disclosed circuitry and methods.

FIG. 3 illustrates an exploded under side perspective view of an assembly 300 that includes a PCB 314 (partially illustrated in FIG. 3) and monolithic power stage (Pstage) package 302 according to one exemplary embodiment of the disclosed circuitry and methods. Monolithic Pstage package 302 includes at least a monolithic Pstage integrated circuit semiconductor die 306 having pins that are electrically coupled (e.g., by soldering) to a lead frame and package substrate 304 (e.g., such as PCB substrate), and that is encased on the substrate 304 by an encapsulant 308 such as plastic, glass, ceramic, epoxy, etc. Other circuit components may also be present inside the package 302 as shown. The lead frame of package 302 thermally and electrically connects each of the pins of the Pstage die 306 to respective electrically and thermally conductive pads (e.g., such as illustrated herein in FIGS. 4-5) that are provided on the bottom side 310 of the Pstage package 302. As shown in FIG. 3, the bottom side of the package substrate 304 is configured for mounting (e.g., by solder) to a top side of the PCB 314 which may be, for example, a notebook computer motherboard or a voltage regulator board which is further illustrated and described in FIGS. 5 and 6. When so mounted, the conductive pads on the bottom of the Pstage package 302 are aligned to and contact metal planes provided on the top side of the PCB 314.

Figure 4:
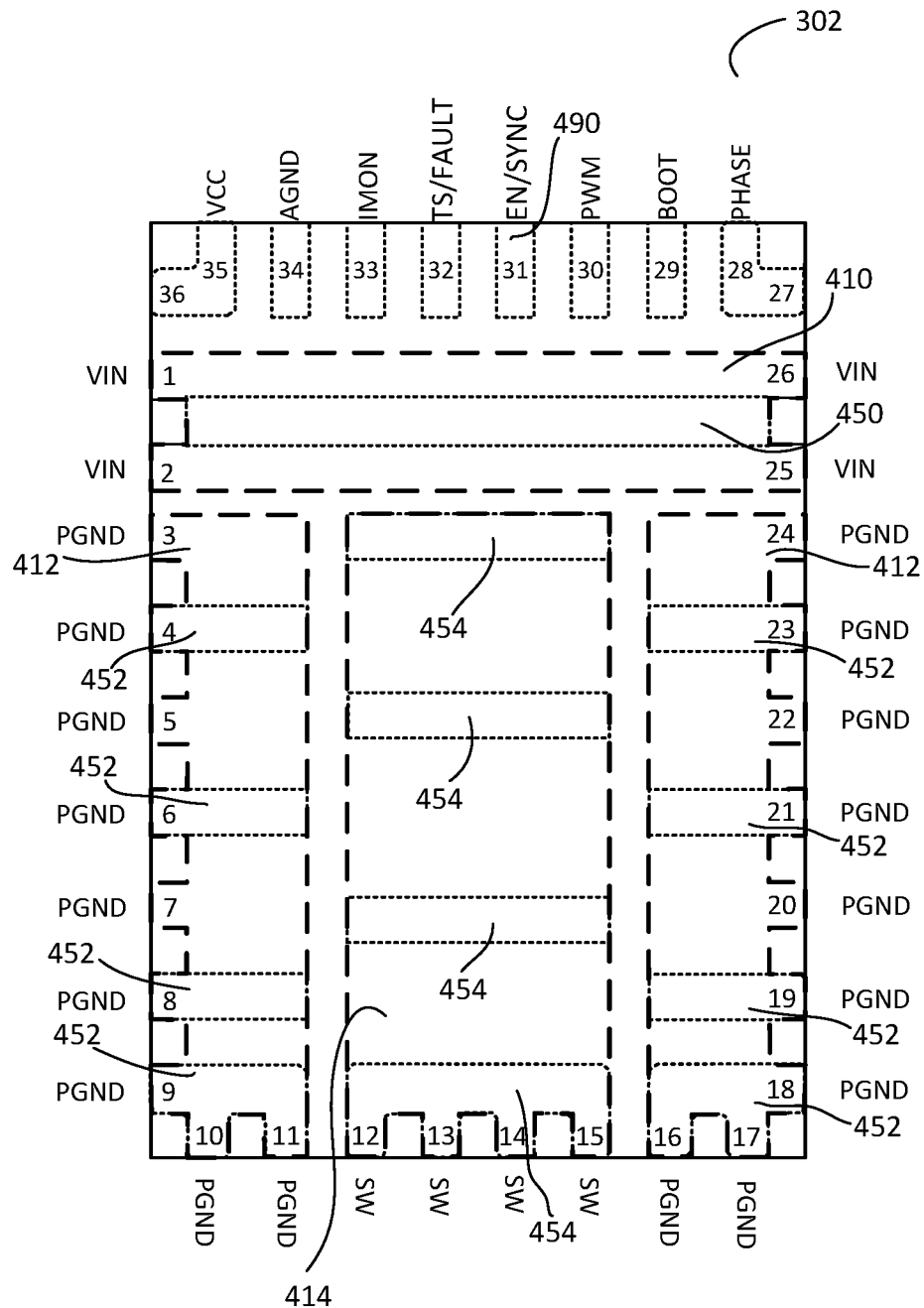
FIG. 4 illustrates an overhead view of a top side of a monolithic Pstage package configured according to one exemplary embodiment of the disclosed circuitry and methods.

FIG. 4 illustrates a top side view of a monolithic Pstage package 302 (including a monolithic Pstage die 306) as it may be configured according to one exemplary embodiment disclosed herein. As described in relation to FIG. 3, Pstage package 302 has a bottom side 310 that is configured to be mechanically mated (e.g., by solder and/or adhesive such as epoxy) to a top side 312 of a PCB 314 that includes VR circuitry, such as VR output power bus/es and in computer server applications may include a VR pulse width modulation (PWM) microcontroller. As shown in FIG. 4, Pstage package 302 has electrically and thermally conductive metal (e.g., copper) pads 410, 412 and 414 shown in dashed hidden lines and disposed and exposed on the bottom side 310 of the Pstage package 302. Conductive pads 410, 412 and 414 overlap and contact conductive metal (e.g., copper) strips 450, 452 and 454, respectively, as shown. Conductive strips 450, 452 and 454 lie between conductive pads 410, 412 and 414 and silicon of Pstage die 306, and are directly connected to silicon of Pstage die 306 for lower copper loss and better thermal performance.

As shown in FIG. 4, an elongated switching node (voltage output and output power) pad 414 and two elongated spaced-apart ground pads 412 are disposed on the surface of the bottom side 310 of the Pstage package 302 with their respective longitudinal axes oriented in parallel relationship to each other. In this embodiment, elongated switching node pad 414 is disposed in adjacent side-by-side relationship to each of the two elongated spaced-apart ground pads 412, and with each of pads 412 and 414 extending inward from a first end of Pstage package 302 toward an opposing second end of Pstage package 302. In the illustrated embodiment, each of pads 412 and 414 extend from the first end of Pstage package 302 across the surface of the bottom side 310 of the Pstage package 302 to terminate at a point beyond the midpoint between the first and second ends of Pstage package 302 (i.e., so as to extend greater than half the distance from the first end of Pstage package 302 to the second end of Pstage package 302). As further shown, switching node pad 414 is disposed in a position between the two spaced-apart ground pads 412.

Also shown in FIG. 4 is an elongated input power (voltage input) pad 410 that is disposed on the surface of the bottom side 310 of the Pstage package 302, and having a longitudinal axis oriented in perpendicular relationship to the respective longitudinal axis of each of elongated switching node pad 414 and elongated ground pads 412. In this embodiment, input power pad 410 is deposed in adjacent side-by-side relationship to the respective ends of each of the first and second ground pads and the switch node pad. As used herein, two given electrically and thermally conductive pads are considered to be disposed in "adjacent side-by-side relationship" to each other on the surface of a bottom side 310 of a Pstage package 302 when no other electrically and thermally conductive pad is disposed on the surface of the bottom side 310 of the Pstage package 302 between the two given electrically and thermally conductive pads.

Figure 5:
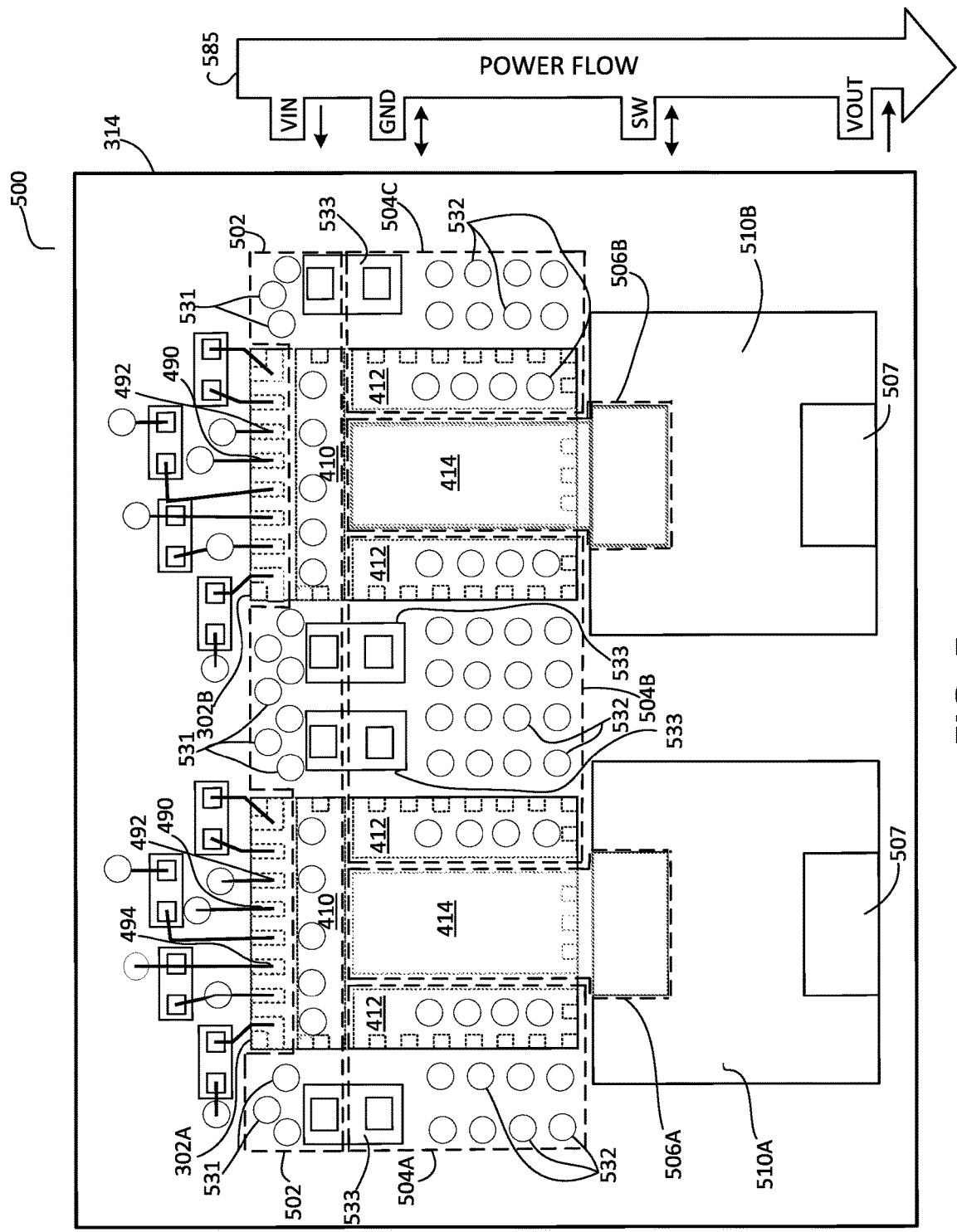
FIG. 5 illustrates an overhead view of a multi-phase VR system according to one exemplary embodiment of the disclosed circuitry and methods.

In the embodiment of FIG. 4, each of conductive pads 410, 412 and 414 are configured to electrically and thermally connect to a corresponding respective thermally and electrically conductive metal (e.g., copper) plane 502, 504 or 506 exposed on the top side 312 of a mated underlying PCB 314 as shown in the multi-phase VR assembly 500 of FIG. 5. In the top view of FIG. 5, each of separate thermally and electrically conductive planes 502, 504 and 506 are shown in dashed outline for purpose of illustration, it being understood that in FIG. 5 a portion of each of conductive planes 502, 504 and 506 is overlain by monolithic Pstage packages 302. Although a two phase VR assembly having two monolithic Pstage packages 302 is illustrated in FIG. 5, it will be understood that a multi-phase VR assembly may be configured with three or more monolithic Pstage packages 302 that are similarly mated to a top side 312 of a PCB 314 that has additional conductive metal plane segments 502, 504 or 506 that are configured to receive each monolithic Pstage package 302 in a similar mated manner.

When monolithic Pstage package 302 is mated to an underlying PCB 314 (as shown in FIGS. 3 and 5), conductive pads 410, 412 and 414 provide multiple respective electrical paths that conduct input DC voltage (VIN) and system ground (PGND) to corresponding respective circuitry of the monolithic Pstage die 306 from respective input power plane 502 and ground plane 504 of the PCB 314, and that conduct a switched (regulated) DC output power from corresponding switching circuitry of the monolithic Pstage die 306 (including high side MOSFET and low side MOSFET of FIG. 6) to a switching node (SW) plane 206 of the PCB 314 in response to control signals received at an adaptive EN/SYNC pin 490, together and/or with PWM signals received at a PWM pin 492. A current monitor ($I_{MON}$) pin 494 is also present, the function of which is described further herein.

Figure 1:
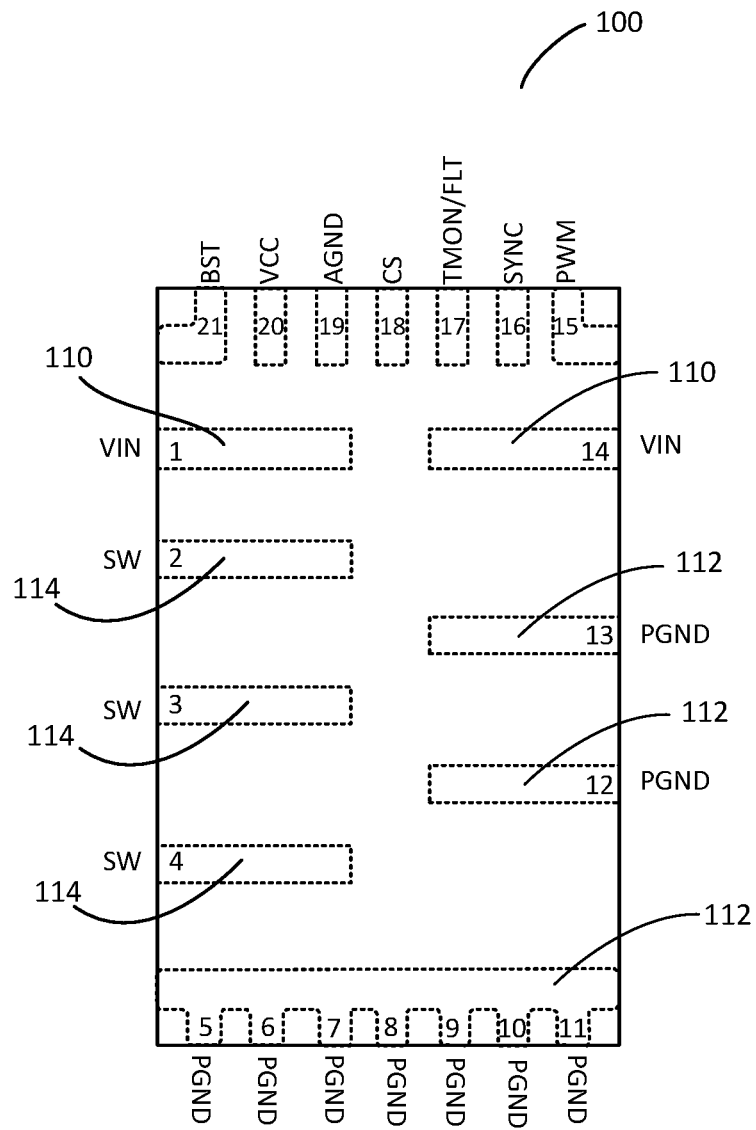
FIG. 1 illustrates an overhead view of a top side of a conventional monolithic Pstage package.
Figure 2:
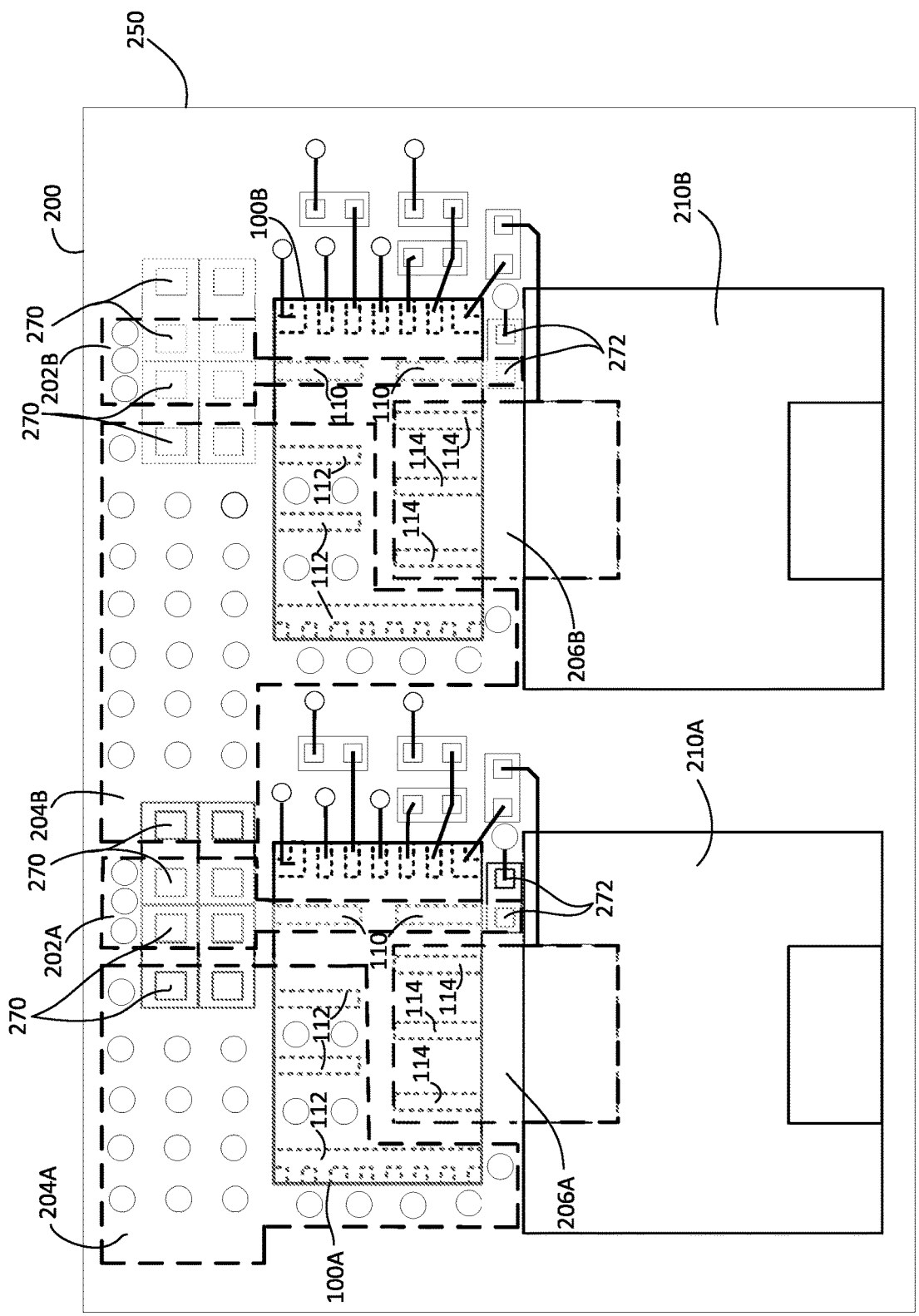
FIG. 2 illustrates an overhead view of a top side of two conventional monolithic Pstage packages mounted on an upper surface of a conventional printed circuit board (PCB).

In one embodiment, the total thermally conductive surface area of conductive pads 410, 412 and 414 represent (or is equal to) greater than or equal to 50% of the total surface area of the bottom side 310 of the monolithic Pstage package 302 to provide a thermal contact area between circuitry of the monolithic Pstage die 306 and circuitry of the monolithic Pstage package 302 that is greater than the thermal contact area provided by a conventional monolithic Pstage package 100 of FIG. 1. As such, conductive pads 410, 412 and 414 provide better thermal relief by presenting a relatively low thermal resistance to heat flow during operation from the monolithic Pstage die 306 and package 302 to the components of top metal layer (conductive metal planes 502, 504 or 506) of an underlying mated PCB 314 as shown in FIG. 5. This relatively low thermal resistance results in lower Pstage die field effect transistor (e.g., such as MOSFET) operating temperature that is conventionally possible, and therefore allows for an increased operating capacity of Pstage die 306, and therefore an increased amount of its available power output 507 to be provided via a corresponding switching node (SW) plane 506 as compared to a conventional Pstage package 100. In one embodiment, the increased heat transfer via conductive pads 410, 412 and 414 from Pstage package 302 to PCB 314 allows the maximum available output power from Pstage package 302 to be provided to the PCB 314 to equal the maximum output power capacity of the monolithic Pstage die 306 of the Pstage package 302.

Referring to the multi-phase VR embodiment of FIG. 5, conductive metal input power plane 502 of PCB 314 is electrically coupled to input voltage VR circuitry within PCB 314 by designated conductive metal (e.g., copper) vias 531 that underlie input power plane 502 on the top side surface 312 of PCB 314 in the positions shown. Similarly, conductive metal ground plane segments 504A/504B/504C of PCB 314 are each coupled to corresponding ground plane circuitry within PCB 314 by other respective designated conductive metal vias 532 that underlie ground plane segments 504A/504B/504C on the top side surface 312 of PCB 314 in the positions shown. Each of conductive switching node planes 506A and 506B are electrically coupled to a respective output inductor 510A or 510B. In one exemplary embodiment output inductors 510A and 510B may underlie switching node planes 506A and 506B, respectively, on the top side surface 312 of PCB 314 in the positions shown. In FIG. 5, a simplified representation 585 illustrates power flow through multi-phase VR assembly 500.

In the embodiment of FIG. 5, the input power (i.e., voltage in) pad 410 of each monolithic Pstage package 302A and 302B is electrically coupled to a common input power plane 502 of PCB 314, i.e., so that the same input power vias 531 and input decoupling capacitors 533 (that underlie input power plane 502 on the top side surface 312 of PCB 314 of FIG. 5) are shared by the input power pads 410 of multiple different monolithic Pstage packages 302A and 302B. During VR operation, multi-phase VR interleaving characteristics enable the same input capacitance 533 and input power vias 531 to be utilized across multiple different monolithic Pstage packages mated to the same PCB 314. Using such a configuration, the input decoupling capacitors 533 may be placed close to the monolithic Pstage packages 302, and the total number of required VR assembly input decoupling capacitors 533 may be reduced for a given number of multiple Pstage packages because each of the input decoupling capacitors 533 are shared by a common input power plane 502 between the input power pads 410 of multiple different Pstage packages 302 rather than being dedicated to a given input power pad 410 of only one Pstage package 302. Reducing the number of input decoupling capacitors 533 results in lower assembly cost and reduced PCB space that is required for input decoupling capacitors 533.

As further shown in FIG. 5, the noisy switching node (including mated switching node pad 414 and switching node plane 506) of each monolithic Pstage package 302A and 302B is shielded on opposing sides by ground walls formed by mated ground pads 412 and ground planes 504. This shielding helps prevent or reduce the amount of VR switching noise imparted from the switching node 414/506 to the input power node 410/502.

Figure 6:
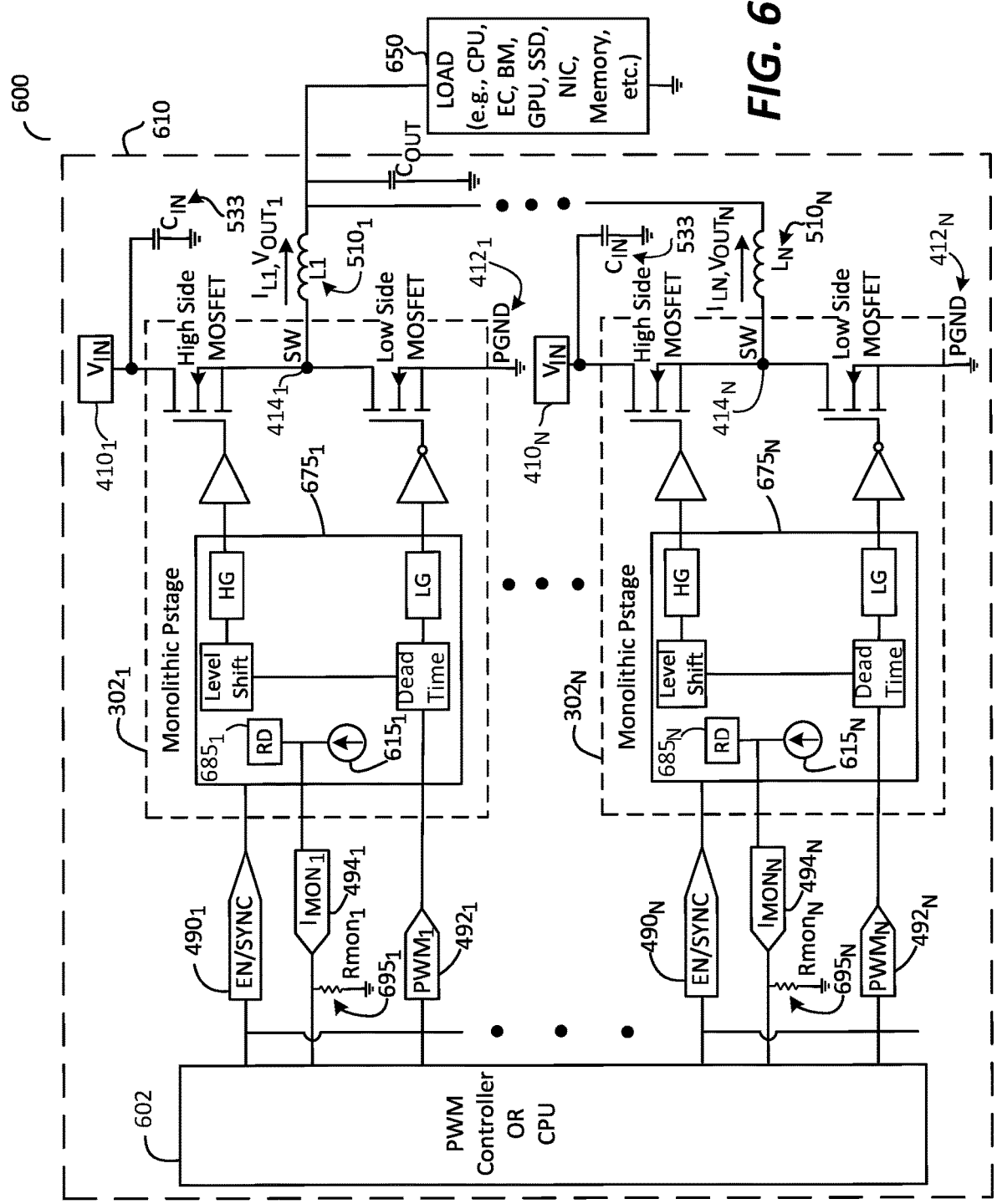
FIG. 6 illustrates a simplified block diagram of circuitry of a multi-phase VR system according to one exemplary embodiment of the disclosed circuitry and methods.

FIG. 6 illustrates one exemplary embodiment of an information handling system 600 that includes a multi-phase VR system 610 coupled to a system load 650 of the information handling system 600. System load 650 may include various power-consuming circuit components, e.g., such as CPU, embedded controller (EC), server baseboard management controller (BMC), graphics processing unit (GPU), storage in the form of solid state drive (SSD), network interface card (NIC), memory such as dynamic random access memory (DRAM) and non-volatile Flash memory, etc. Information handling system 600 may be, for example, a computer server, battery-powered portable information handling system such as notebook computer or tablet computer, etc. Example system and system load component configurations for such information handling systems are found, for example, in U.S. patent application Ser. No. 17/146,428 filed Jan. 11, 2021; U.S. Pat. Nos. 10,432,007; 10,354,356; and 10,372,575, each of which is incorporated herein by reference in its entirety for all purposes.

FIG. 6 illustrates a simplified block diagram of circuitry of a multi-phase VR system 610 that is implemented with multiple monolithic Pstage packages $302_1$ to $302_N$ coupled to at least one programmable integrated circuit 602 on a PCB 314 such as illustrated in FIG. 5. In the embodiment of FIG. 6, N may be an integer number of greater than or equal to two, and the multi-phase VR assembly 500 of FIG. 5 corresponds to a two-phase VR system embodiment in which N=2 (i.e., with Pstage package 302A corresponding to a Pstage package $302_1$ of FIG. 6 and Pstage package 302B corresponding to a Pstage package $302_2$ of FIG. 6). A VR programmable integrated circuit 602 of FIG. 6 may be provided as, for example, a PWM microcontroller of a computer server or may be a central processing unit (CPU) of a notebook computer that is configured to provide control signals to adaptive EN/SYNC pins $490_1$ to $490_N$, and to provide PWM signals to PWM pins $492_1$ to $492_N$.

As shown in FIG. 6, each of monolithic Pstages $302_1$ to $302_N$ has a high side field effect transistor in the form of a high side MOSFET, a low side field effect transistor in the form of a low side MOSFET, and an individual switched current output provided through a respective inductor $510_1$ to $510_N$ as regulated output power ($I_{L1}$, $V_{OUT1}$) to ($I_{LN}$, $V_{OUTN}$), respectively. The combined regulated output power from monolithic Pstages $302_1$ to $302_N$ may be coupled as shown to an electrical system load 650 (e.g., programmable integrated circuits, cooling fans, memory devices, storage devices, etc.) of information handling system 600, such as server computer, desktop computer, notebook computer, tablet computer, etc.

In the embodiment of FIG. 6, monolithic Pstages $302_1$ to $302_N$ may include respective circuitry and Pstage programmable integrated circuits (e.g., microcontrollers) $675_1$ to $675_N$, respectively, that are programmed to execute logic for operation of the corresponding Pstage 302, e.g., such as current sense logic, high side driver logic (HG) and low side driver logic (LG), etc. In this regard, each of monolithic Pstages $302_1$ to $302_N$ may be implemented as a smart power stage configured and programmed to implement these and other logic components as part of a multi-phase VR system such as described, for example, in U.S. Pat. Nos. 7,999,520, 9,678,555, 9,240,722, and 9,787,172, each of which is incorporated herein by reference in its entirety for all purposes.

Still referring to FIG. 6, respective external resistances ($R_{MON1}$ to $R_{MONN}$) may be provided on PCB 314 and coupled to respective $I_{MON1}$ to $I_{MONN}$ pins $494_1$ to $494_N$ of monolithic Pstages $302_1$ to $302_N$. As further described, the value of resistances $R_{MON1}$ to $R_{MONN}$ may be selected or otherwise designated to correspond to the type of information handling system 650 in which the multi-phase VR system 610 is currently deployed, e.g., a relatively higher power information handling system application such as a computer server or a relatively lower power information handling system application such as a notebook computer. The Pstage programmable integrated circuits (e.g., microcontrollers) $675_1$ to $675_N$ of respective monolithic Pstages $302_1$ to $302_N$ may in turn be coupled to respective $I_{MON1}$ to $I_{MONN}$ pins $494_1$ to $494_N$, and configured and programmed to sense or otherwise determine a magnitude of a corresponding respective resistance $R_{MON1}$ to $R_{MONN}$ on PCB 314. For example, in one exemplary embodiment, the programmable integrated circuit 675 of each monolithic Pstage 302 may be configured to use the relationship R=V/I to determine a resistance value of its respective $R_{MON}$, e.g., by using a resistance determination (RD) circuit 685 such as an internal voltage comparator or other suitable internal circuitry to measure real time voltage at its respective $R_{MON}$ pin 494 while at the same time applying a known current (I) to the respective $I_{MON}$ pin 494 from an internal current source 615.

Figure 7:
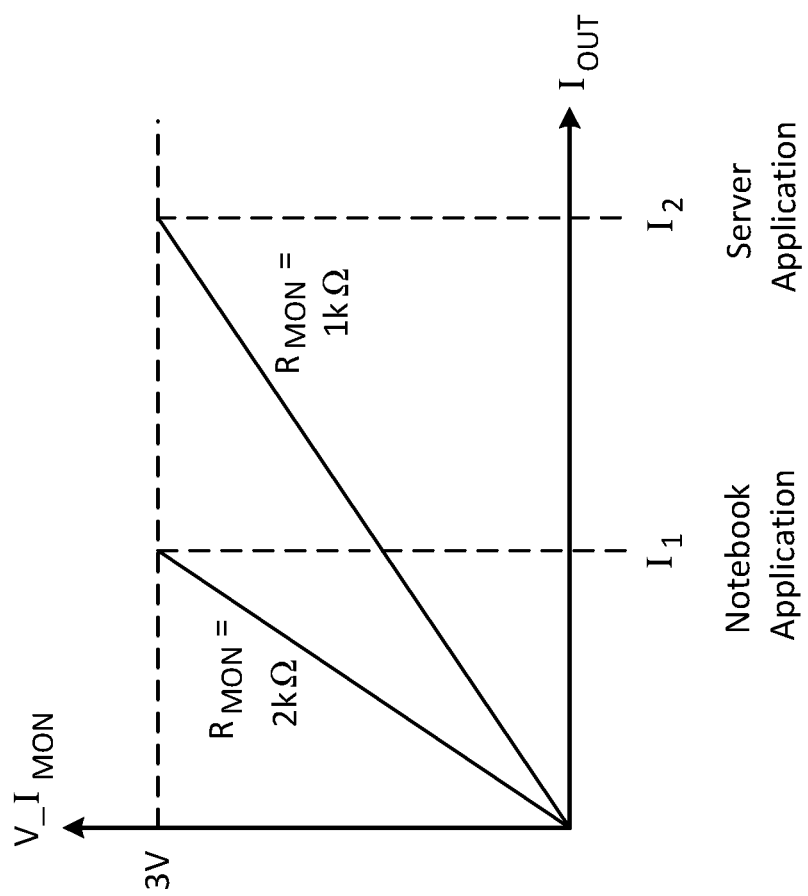
FIG. 7 illustrates $I_{MON}$ pin voltage versus $I_{MON}$ pin current output according to one exemplary embodiment of the disclosed circuitry and methods.

FIG. 7 illustrates an example relationship of voltage at $I_{MON}$ pin 494 versus current output ($I_{OUT}$) at $I_{MON}$ pin 494 for an example embodiment of the disclosed monolithic Pstage 302 (which in this example corresponds to one of monolithic Pstages $302_1$ to $302_N$). In the illustrated example, the programmable integrated circuit 602 of each monolithic Pstage 302 detects or otherwise determines the external resistance ($R_{MON}$) of its respective $I_{MON}$ pin 494, which target the same voltage at full loads (e.g., 3 Volts) for PWM controller or CPU 602 current reporting. In this embodiment, each $R_{MON}$ component $695_1$ to $695_2$ on PCB 314 may be selected and installed on PCB 314 of an information handling system 600 during system manufacture to have a designated resistance value of 2 kΩ in the case of a relatively lower power application (e.g., battery-powered portable information handling system such as notebook computer) or selected and installed on PCB 314 to be a designated resistance value of 1 kΩ in the case of a relatively higher power application (e.g., computer server). Thus, all of $R_{MON}$ component $695_1$ to $695_2$ have the same selected resistance value for a given information handling system application that matches the resistance value that is designated for the type of information handling system 600 in which VR system 610 is currently installed.

As shown in FIG. 7, if the programmable integrated circuit 675 of monolithic Pstage 302 determines the value of $R_{MON}$ is 1 kΩ during normal system operation after manufacture, it is programmed automatically set its adaptive EN/SYNC pin 490 and circuitry for EN functionality (e.g., to support a first type of external control signals or commands received from a PWM microcontroller 602 of a computer server) and to control MOSFETs outputs a relatively higher power output level of 60 Amps (I2) at 3 Volts to system load 650 as its full loading for a relatively higher power computer server application. However, if the programmable integrated circuit 675 of monolithic Pstage 302 determines the value of $R_{MON}$ is 2 kΩ during normal system operation after manufacture, it is programmed to automatically set its adaptive EN/SYNC pin 490 and circuitry for SYNC functionality (e.g., to support a second and different type of external control signals or commands received from a CPU 602 such as Intel PS4 processor for a battery-powered portable information handling system application) and outputs a relatively lower output power level of 30 Amps (I1) at 3 Volts as its full loading for a relatively lower power portable information handling system application. It will be understood that the relatively higher output power level of 60 Amps (I2) at 3 Volts and the relatively lower output power level of 30 Amps (I1) at 3 Volts are exemplary only, and that any other combination of at least two different power output level values may be alternatively provided selectively by a monolithic Pstage 302. It will also be understood that the designated 1 kΩ and 2 kΩ values of $R_{MON}$ are exemplary only, and that any other combination of different designated greater or lesser resistance values of $R_{MON}$ may be alternatively provided on a PCB 314 and sensed by a monolithic Pstage 302 to determine and provide a selected output power level.

Table 1 below shows an example criteria that may be automatically employed by a programmable integrated circuit 675 of a Pstage package 302 when adaptively setting a multi-function EN/SYNC pin is set to EN function (e.g., Computer Server) or SYNC function (e.g., notebook computer). In an identified computer server application, the EN functionality requires a fast timing response to turn off the MOSFET once a failure happens. In a notebook computer application, the SYNC functionality must support an Intel PS4 processor feature for lower quiescent power. In Table 1, "GH" is high side MOSFET gate voltage, "GL" is low side MOSFET gate voltage, and the Tri-state level is between the High and Low voltage levels (aka 1.6 Volts).

TABLE 1

|  | High Level | Low Level | Tri-state Level (action taken by Rmon judgement) |
|---|---|---|---|
| EN/SYNC (Server/Notebook) | GH/GL follow PWM | GH/GL are low | Server: N/A Notebook: GH/GL are low, and chip enters the power saving mode (PS4) |

It will be understood that the selected values of $I_{MON}$ pin voltage, external $R_{MON}$ resistance and Pstage output current for the example of FIG. 7 are exemplary only, and any or all of these values may be selected to be any other greater or lesser value as suited for a particular VR implementation.

Thus, the same monolithic Pstage 302 may be configured to determine, and adapt to, the particular power application (e.g., relatively lower power or relatively higher power application) into which it has been installed. In this way a common monolithic Pstage 302 may be manufactured for use in multiple VR power applications, i.e., for use in either a relatively higher power application such has a computer server or in a relatively lower power application such as a battery-powered portable information handling system like a notebook computer.

Figure 8:
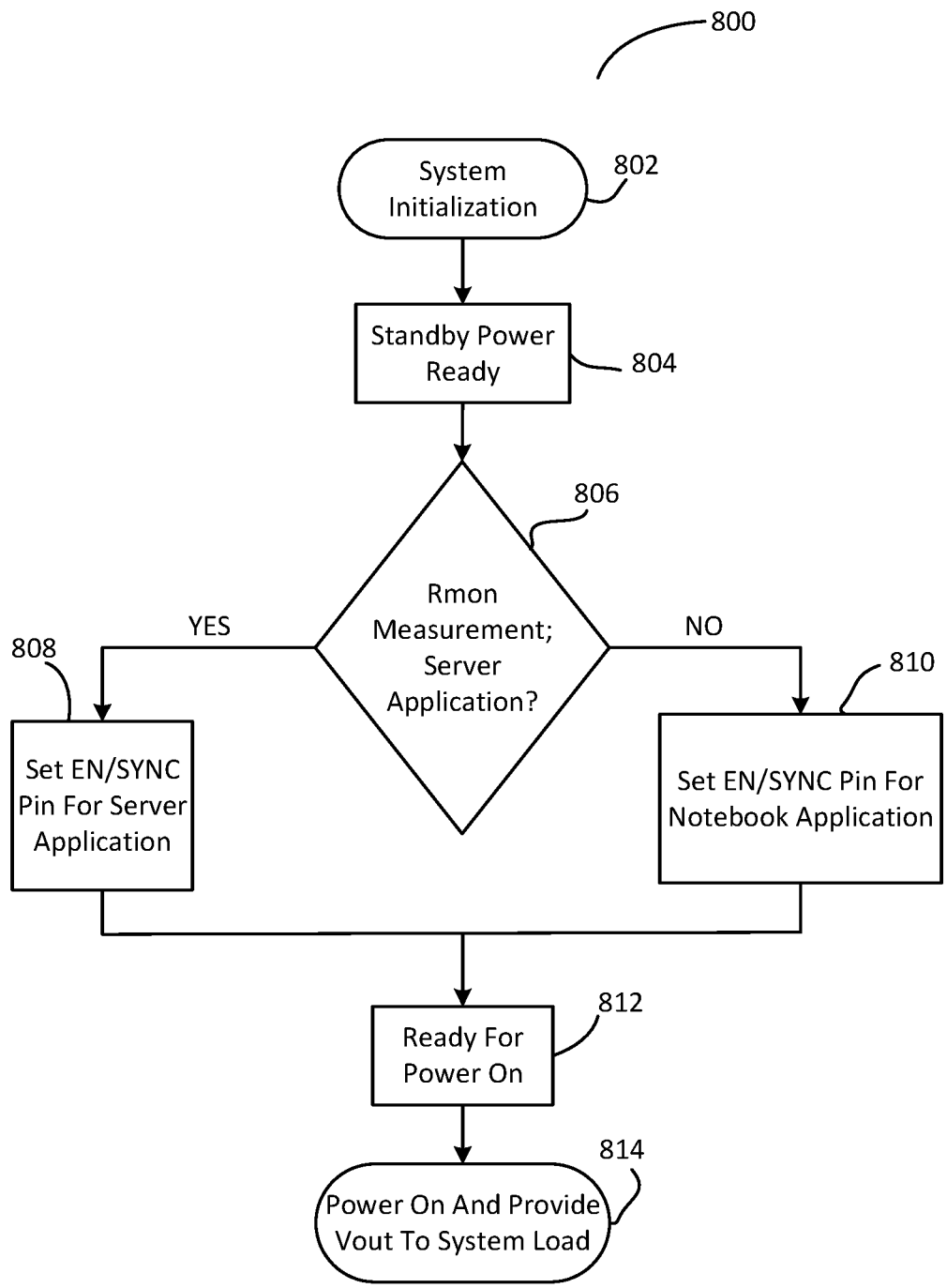
FIG. 8 illustrates methodology according to one exemplary embodiment of the disclosed circuitry and methods

FIG. 8 illustrates one exemplary embodiment of a methodology 800 that may be employed to operate a multi-phase VR system 610 having multiple monolithic Pstage packages $302_1$ to $302_N$ installed in an information handling system 600 such as illustrated and described in relation to FIG. 6. As shown, methodology 800 starts in block 802 with VR system initiation, e.g., upon power up of information handling system 600. This is followed by stand by power ready condition in block 804.

Next, in block 806, the programmable integrated circuit 675 of each of multiple monolithic Pstages $302_1$ to $302_N$ determines the value of its respective external resistor ($R_{MON}$) $695_1$ to $695_N$. on PCB 314 and coupled to its respective $I_{MON}$ pin $494_1$ to $494_N$ in a manner as previously described. In this example, all $R_{MON}$ resistors $695_1$ to $695_N$ have a first designated resistance value (e.g., 2 kΩ) in the case of a relatively lower power notebook computer application or have a second designated resistance value (e.g., 1 kΩ) in the case of a relatively higher power computer server application.

If each of the programmable integrated circuits $675_1$ to $675_N$ determines in block 806 that its respective $R_{MON}$ resistor 695 has the first resistance value, then each of the programmable integrated circuits 675 determines in block 806 that the current information handling system application identity is not a relatively higher powered computer server application, and proceeds to block 810 where each of the programmable integrated circuits $675_1$ to $675_N$ sets its respective adaptive EN/SYNC pin 490 and circuitry for SYNC functionality (e.g., to support control signals or commands from a CPU such as Intel PS4 processor for a notebook computer application). VR system is now ready for system power on in block 812, and provides a first relatively lower output power level by outputting 30 Amps as its full loading in block 814 under the control of programmable integrated circuit 602 for system load 650 of a notebook computer 600 in which the VR system 610 is currently installed.

However, if each of the programmable integrated circuits $675_1$ to $675_N$ determines in block 806 that its respective $R_{MON}$ resistor 695 has the second resistance value, then each of the programmable integrated circuits 675 determines in block 806 that the current information handling system application identity is a relatively higher powered computer server application, and proceeds to block 808 where each of the programmable integrated circuits $675_1$ to $675_N$ sets its respective adaptive EN/SYNC pin 490 and circuitry for EN functionality (e.g., to support control signals or commands from a PWM microcontroller of a computer server). VR system is now ready for system power on in block 812, and outputs 60 Amps as its full loading in block 814 under the control of programmable integrated circuit 602 for system load 650 of a computer server 600 in which the VR system 610 is currently installed.

It will be understood that the particular order and identity of the blocks of methodology 800 is exemplary only, and that any other combination of additional, fewer, and/or alternative blocks may be employed in other embodiments to operate a multi-phase VR system 610 installed in an information handling system 600 (e.g., such as illustrated and described in relation to FIG. 6) to achieve one or more of the VR system functionalities described herein.

Figure 9:
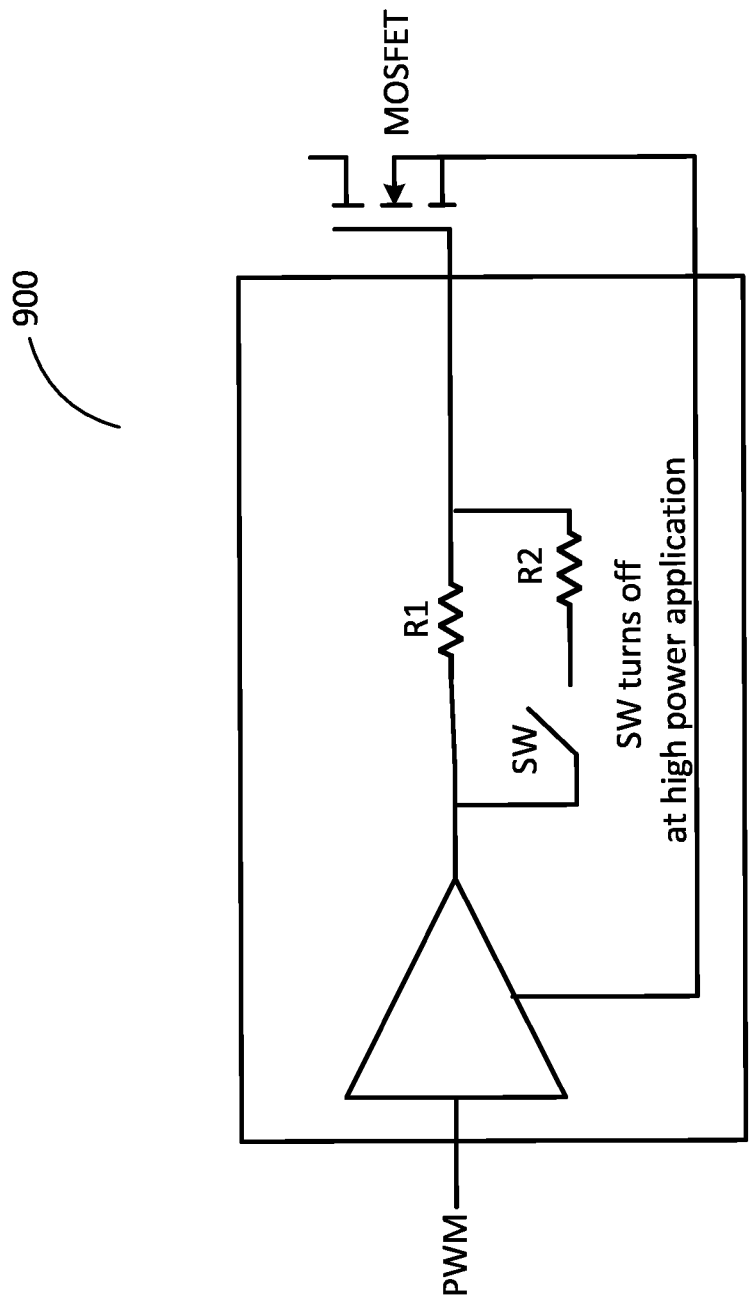
FIG. 9 illustrates an automatic tuning circuit according to one exemplary embodiment of the disclosed circuitry and methods.

FIG. 9 illustrates an automatic tuning circuit 900 that may be implemented in one exemplary embodiment within a monolithic Pstage die 306 for determining MOSFET driver strength according to the information handling system application identification made in block 806 of FIG. 8. As shown in FIG. 9, switch (SW) is turned off for relatively higher power application (e.g., such as a computer server) to reduce power noise and voltage spike.

It will be understood that one or more of the tasks, functions, or methodologies described herein (e.g., including those described herein for components 602, 675, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program includes instructions that are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an processing system or component thereof. The executable instructions may include a plurality of code segments operable to instruct components of an processing system to perform the methodologies disclosed herein.

It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed circuitry and methods may be utilized in various combinations and/or independently. Thus the invention is not limited to only those combinations shown herein, but rather may include other combinations.

What is claimed is:

1. A monolithic power stage (Pstage) package, comprising:
   a monolithic Pstage integrated circuit comprising a voltage input, a voltage output, a ground node, and one or more field effect transistor (FET) switching devices coupled between the voltage input, the ground node and the voltage output and providing regulated power to the voltage output; and
   multiple separate electrically and thermally conductive pads exposed on a bottom side surface of the monolithic Pstage package, the multiple separate electrically and thermally conductive pads comprising an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit;
   where the switching node pad is disposed on the monolithic Pstage package bottom side surface between, and in adjacent side-by-side relationship to, the first and second ground pads; and
   where the input power pad extends between opposing sides of the monolithic Pstage package bottom side surface and is disposed in adjacent side-by-side relationship to each of the first and second ground pads and the switching node pad.

2. The monolithic Pstage package of claim 1, where the switching node pad is an elongated switching node pad having a longitudinal axis, where each of the first and second ground pads is an elongated ground pad having a longitudinal axis; and where the longitudinal axis of the switching node pad is oriented in parallel relationship to the longitudinal axis of each of the first and second elongated ground pads.

3. The monolithic Pstage package of claim 2, where the input power pad is an elongated input power pad having a longitudinal axis; and where the longitudinal axis of the elongated input power pad is oriented in perpendicular relationship to the respective longitudinal axes of the elongated switching node pad and the first and second elongated ground pads.

4. The monolithic Pstage package of claim 3, where each of the elongated switching node pad and the first and second elongated ground pads have the same length.

5. The monolithic Pstage package of claim 1, where the total surface area of the multiple separate electrically and thermally conductive pads is greater than or equal to 50% of the total surface area of the bottom side of the monolithic Pstage package.

6. The monolithic Pstage package of claim 1, further comprising a programmable integrated circuit, the programmable integrated circuit being programmed to control the FET switching devices to provide either a relatively higher output power level or a relatively lower output power level to the switching node pad based on different values of sensed resistance presented to the programmable integrated circuit by external circuitry on a mated printed circuit board (PCB).

7. The monolithic Pstage package of claim 6, where the programmable integrated circuit is programmed to control the FET switching devices to:
   respond to a first type of external control signals to provide the relatively higher output power level in response to sensing a first designated resistance value presented to the programmable integrated circuit by the external circuitry on the mated printed circuit board (PCB); and
   provide to a second type of external control signals to provide the relatively lower output power level in response to sensing a second designated resistance value presented to the programmable integrated circuit by the external circuitry on the mated printed circuit board (PCB);
   where the first designated resistance value is different from the second designate resistance value; and where the first type of external control signals are different from the second type of external control signals.

8. The monolithic Pstage package of claim 1, where the total thermally conductive surface area of the multiple separate electrically and thermally conductive pads is greater than or equal to 50% of the total surface area of the bottom side surface of the monolithic Pstage package.

9. An information handling system, comprising:
   a printed circuit board (PCB);
   a system load; and
   at least one monolithic power stage (Pstage) package mechanically mated to a top side surface of the PCB, the monolithic Pstage package comprising:
      a monolithic Pstage integrated circuit comprising a voltage input, a voltage output, a ground node, and one or more field effect transistor (FET) switching devices coupled between the voltage input, the ground node and the voltage output and providing regulated power to the voltage output, and
      multiple separate electrically and thermally conductive pads exposed on a bottom side surface of the monolithic Pstage package, the multiple separate electrically and thermally conductive pads comprising an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit;
      where the switching node pad is disposed on the monolithic Pstage package bottom side surface between and in adjacent side-by-side relationship to the first and second ground pads, and where the input power pad extends between opposing sides of the monolithic Pstage package bottom side surface and is disposed in adjacent side-by-side relationship to each of the first and second ground pads and the switching node pad;

where the input power pad is thermally and electrically coupled to a thermally and electrically conductive input power plane disposed on the top side surface of the PCB; where the first and second ground pads are thermally and electrically coupled to respective thermally and electrically conductive first and second ground planes disposed on the top side surface of the PCB; and where the switching node pad is thermally and electrically coupled to a thermally and electrically conductive switching node plane disposed on the top side surface of the PCB; and where the switching node plane is electrically coupled to the system load and is disposed on the PCB top side surface between and in adjacent side-by-side relationship to the first and second first and second ground planes, and where the input power plane is disposed on the PCB top side surface in adjacent side-by-side relationship to each of the first and second ground planes and the switching node plane.

10. The information handling system of claim 9, where the switching node pad is an elongated switching node pad having a longitudinal axis, where each of the first and second ground pads is an elongated ground pad having a longitudinal axis, the longitudinal axis of the switching node pad being oriented in parallel relationship to the longitudinal axis of each of the first and second elongated ground pads; and where the switching node plane of the PCB is an elongated switching node plane having a longitudinal axis oriented parallel to the longitudinal axis of the elongated switching node pad.

11. The information handling system of claim 10, where the input power pad is an elongated input power pad having a longitudinal axis; where the longitudinal axis of the elongated input power pad is oriented in perpendicular relationship to the respective longitudinal axes of the elongated switching node pad and the first and second elongated ground pads; and where the input power plane is an elongated input power plane having a longitudinal axis oriented parallel to the longitudinal axis of the elongated input power pad, the input power plane extending beyond opposing sides of the monolithic Pstage package bottom side surface.

12. The information handling system of claim 11, further comprising at least two of the monolithic Pstage packages mechanically mated in side-by-side relationship to the top side surface of the PCB; where the elongated input power plane of the PCB is a single elongated input power plane that is thermally and electrically coupled to the elongated input power pad of each of the at least two monolithic Pstage packages; and where one of the first and second elongated ground pads of each of the monolithic Pstage packages is thermally and electrically coupled to the same one of the first and second ground planes of the PCB.

13. The information handling system of claim 12, where the PCB further comprises multiple input power vias electrically coupled to the single elongated input power plane and multiple input decoupling capacitors electrically coupled to the single elongated input power plane so that the multiple input power vias and multiple input decoupling capacitors are shared by the elongated input power pads of the at least two monolithic Pstage packages.

14. The information handling system of claim 9, where the total surface area of the multiple separate electrically and thermally conductive pads is greater than or equal to 50% of the total surface area of the bottom side of the monolithic Pstage package.

15. The information handling system of claim 9, where the PCB further comprises an external resistor; where the at least one monolithic Pstage package further comprises a programmable integrated circuit coupled to the external resistor on the PCB, the programmable integrated circuit being programmed to:
sense a resistance presented to the monolithic Pstage package by the external resistor; and
control the FET switching devices to provide either a relatively higher output power level or a relatively lower output power level to the system load through the switching node pad of the monolithic Pstage package and the switching node plane of the PCB based on the sensed resistance presented to the programmable integrated circuit by the external resistor on the PCB.

16. The information handling system of claim 15, further comprising a second programmable integrated circuit on the PCB that is electrically coupled to provide external control signals to the programmable integrated circuit of the monolithic Pstage package; and where the programmable integrated circuit of the monolithic Pstage package is programmed to control the FET switching devices to:
respond to a first type of external control signals from the second programmable integrated circuit on the PCB to provide the relatively higher output power level in response to sensing a first designated value of resistance presented to the programmable integrated circuit of the monolithic Pstage package by the external resistor on the PCB; and
respond to a second type of external control signals from the second programmable integrated circuit on the PCB to provide the relatively lower output power level in response to sensing a second designated value of resistance presented to the programmable integrated circuit of the monolithic Pstage package by the external circuitry on the PCB;
where the first designated value of resistance is different from the second designated value of resistance, and where the first type of external control signals are different from the second type of external control signals.

17. A method, comprising:
receiving an input voltage at a voltage input of at least one monolithic power stage (Pstage) integrated circuit of a monolithic Pstage package, the at least one monolithic Pstage integrated circuit further comprising a voltage output, a ground node, and one or more field effect transistor (FET) switching devices coupled between the voltage input, the ground node and the voltage output; and
controlling the one or more field effect transistor (FET) switching devices to provide regulated power to the voltage output of the at least one monolithic Pstage integrated circuit to power a system load of an information handling system;
where the at least one monolithic power stage (Pstage) package comprises:
multiple separate electrically and thermally conductive pads exposed on a bottom side surface of the monolithic Pstage package, the multiple separate electrically and thermally conductive pads comprising an input power pad coupled to the voltage input of the monolithic Pstage integrated circuit, first and second ground pads coupled to the ground node of the monolithic Pstage integrated circuit, and a switching node pad coupled to the voltage output of the monolithic Pstage integrated circuit; and where the switching node pad is disposed on the monolithic Pstage package bottom side surface between and in adjacent side-by-side relationship to the first and second ground pads, and where the input power pad extends between opposing sides of the monolithic Pstage package bottom side surface and is disposed in adjacent side-by-side relationship to each of the first and second ground pads and the switching node pad;

where the at least one monolithic power stage (Pstage) package is mechanically mated to a top side surface of a printed circuit board (PCB);

where the input power pad is thermally and electrically coupled to a thermally and electrically conductive input power plane disposed on the top side surface of the PCB; where the first and second ground pads are thermally and electrically coupled to respective thermally and electrically conductive first and second ground planes disposed on the top side surface of the PCB; and where the switching node pad is thermally and electrically coupled to a thermally and electrically conductive switching node plane disposed on the top side surface of the PCB; and where the switching node plane is electrically coupled to the system load and is disposed on the PCB top side surface between and in adjacent side-by-side relationship to the first and second first and second ground planes, and where the input power plane is disposed on the PCB top side surface in adjacent side-by-side relationship to each of the first and second ground planes and the switching node plane.

18. The method of claim 17, where the switching node pad is an elongated switching node pad having a longitudinal axis, where each of the first and second ground pads is an elongated ground pad having a longitudinal axis, the longitudinal axis of the switching node pad being oriented in parallel relationship to the longitudinal axis of each of the first and second elongated ground pads; where the switching node plane of the PCB is an elongated switching node plane having a longitudinal axis oriented parallel to the longitudinal axis of the elongated switching node pad; where the input power pad is an elongated input power pad having a longitudinal axis; where the longitudinal axis of the elongated input power pad is oriented in perpendicular relationship to the respective longitudinal axes of the elongated switching node pad and the first and second elongated ground pads; and where the input power plane is an elongated input power plane having a longitudinal axis oriented parallel to the longitudinal axis of the elongated input power pad, the input power plane extending beyond opposing sides of the monolithic Pstage package bottom side surface.

19. The method of claim 17, where the PCB further comprises an external resistor electrically coupled to the monolithic Pstage package; and where the method further comprises:

sensing a resistance presented to the monolithic Pstage package by the external resistor; and then controlling the FET switching devices to provide either a relatively higher output power level or a relatively lower output power level to the system load through the switching node pad of the monolithic Pstage package and the switching node plane of the PCB based on the sensed resistance value of the external resistor on the PCB.

20. The method of claim 19, further comprising:

providing external control signals to the monolithic Pstage package; and controlling the FET switches of the monolithic Pstage package to:

respond to a first type of the provided external control signals to provide the relatively higher output power level in response to sensing a first designated value of resistance presented to the monolithic Pstage package by the external resistor on the PCB, and respond to a second type of external control signals to provide the relatively lower output power level in response to determining a second designated value of resistance presented to the monolithic Pstage package by the external circuitry on the PCB;

where the first designated value of resistance is different from the second designated value of resistance, and where the first type of external control signals are different from the second type of external control signals.

* * * * *